(12) United States Patent
Wu et al.

(10) Patent No.: US 11,133,283 B2
(45) Date of Patent: Sep. 28, 2021

(54) INTEGRATED FAN-OUT DEVICE

(71) Applicant: Taiwan Semiconductor Manufacturing Company, Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/573,421

(22) Filed: Sep. 17, 2019

(65) Prior Publication Data

US 2021/0082871 A1    Mar. 18, 2021

(51) Int. Cl.
| | |
|---|---|
| H01L 23/00 | (2006.01) |
| H01L 23/31 | (2006.01) |
| H01L 21/56 | (2006.01) |
| H01L 21/683 | (2006.01) |
| H01L 23/538 | (2006.01) |
| H01L 21/60 | (2006.01) |
| H01L 25/065 | (2006.01) |

(52) U.S. Cl.
CPC ............ *H01L 24/97* (2013.01); *H01L 21/561* (2013.01); *H01L 21/6836* (2013.01); *H01L 23/3114* (2013.01); *H01L 23/5386* (2013.01); *H01L 21/56* (2013.01); *H01L 25/0657* (2013.01); *H01L 2021/6006* (2013.01); *H01L 2224/023* (2013.01); *H01L 2225/1035* (2013.01); *H01L 2225/1058* (2013.01)

(58) Field of Classification Search
CPC . H01L 24/97; H01L 23/5386; H01L 23/3114; H01L 21/6836; H01L 21/561; H01L 21/56; H01L 2224/023; H01L 2225/1058; H01L 2225/1035; H01L 25/0657; H01L 2021/6006
See application file for complete search history.

(56) References Cited

U.S. PATENT DOCUMENTS

| | | | |
|---|---|---|---|
| 5,241,133 A | * | 8/1993 | Mullen, III ......... H01L 23/3121 174/534 |
| 9,000,584 B2 | | 4/2015 | Lin et al. |
| 9,048,222 B2 | * | 6/2015 | Hung .................. H01L 23/528 |
| 9,048,233 B2 | | 6/2015 | Wu et al. |
| 9,064,879 B2 | | 6/2015 | Hung et al. |

(Continued)

*Primary Examiner* — Kyoung Lee
*Assistant Examiner* — Christina A Sylvia
(74) *Attorney, Agent, or Firm* — Slater Matsil, LLP

(57) ABSTRACT

Integrated fan-out devices, wafer level packages, and methods of manufacturing the same are described herein. Die-attach pads and leveling film are used to attach a plurality of heterogeneous semiconductor dies to a substrate to align external contacts of the semiconductor dies at a first level. The leveling film may also be used during deposition of an encapsulant to at least partially fill a gap between the semiconductor dies. Once the leveling film is removed, a protection layer is formed over the semiconductor dies and within a recess of the encapsulant left behind by the leveling film during encapsulation. A redistribution layer and external connectors are formed over the protection layer to form the InFO device and an interposer may be attached to the redistribution layer to form the wafer level package.

20 Claims, 14 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2008/0237828 A1* | 10/2008 | Yang ............... H01L 23/5389 257/690 |
| 2013/0032947 A1* | 2/2013 | Park ................ H01L 23/544 257/774 |
| 2014/0295620 A1* | 10/2014 | Ito .................. H01L 25/50 438/108 |
| 2016/0218057 A1* | 7/2016 | Lee ................. H01L 21/486 |
| 2018/0315728 A1* | 11/2018 | Pei ................. H01L 24/73 |

\* cited by examiner

INTEGRATED FAN-OUT DEVICE

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages. Wafer fabrication processes (e.g., backside grinding, chemical mechanical planarization (CMP), annealing, and the like) introduce stresses (e.g., wafer warpage, thermal cycling, and the like) to the materials and structures of the packages being fabricated. These stresses can cause defects, for example, micro-cracking in molding compounds and redistribution layers leading to lower production yields, material waste, higher production costs and increased production time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
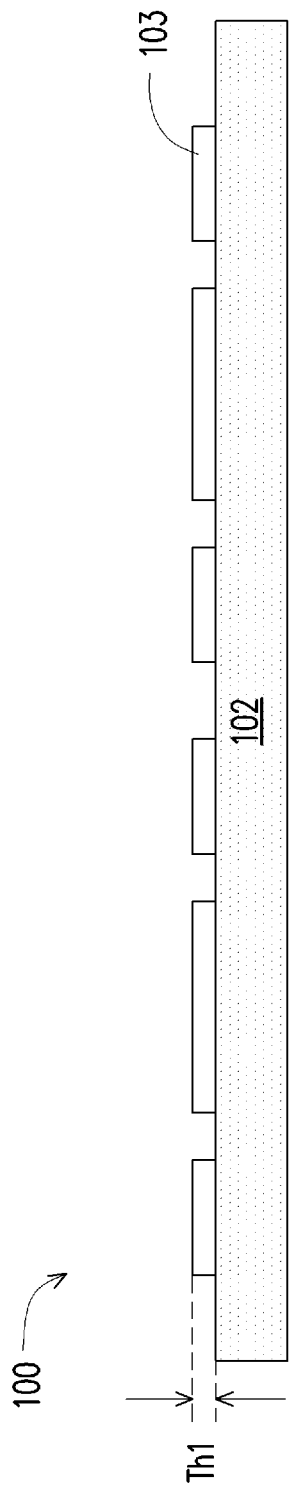
FIGS. 1A through 8 illustrate cross-sectional views of intermediate steps of forming an integrated fan-out device, in accordance with some embodiments.
Figure 1B:
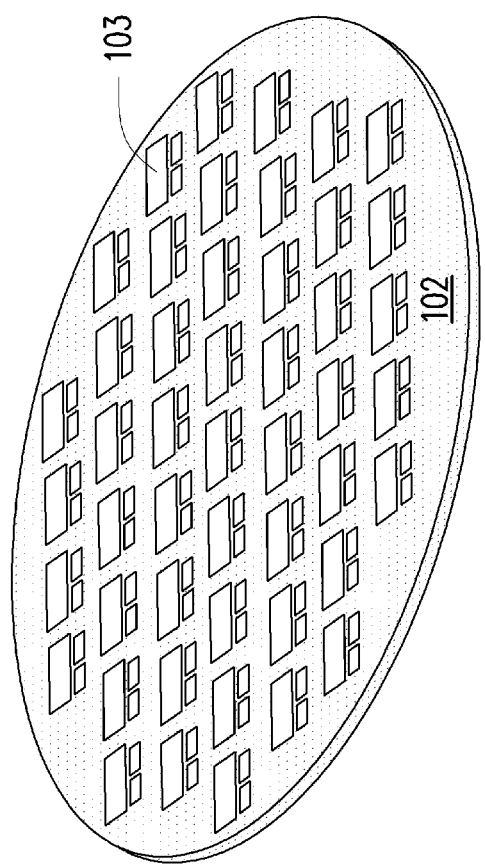

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a device package and the formation thereof are described. The device package may be, for example, a system-in-package. In some embodiments, the system-in-package may integrate heterogeneous dies embedded within a molding compound using a PM coating to protect die-to-die corner areas to reduce cracking within the molding compound that propagates to the PM coating due to wafer warpage and/or due to physical and thermal stresses imparted to the wafer during processing (e.g., grinding, torturing by reliability stress, multi-reflow, thermal cycling and the like). According to some embodiments, a redistribution structure (e.g., a fan-out structure) may be formed over the PM coating. As such, the PM coating prevents fine line cracks from propagating into the redistribution structure. As such, the PM coating provides rigidity to the device package and prevents damage due to warping and/or delamination during wafer fabrication. Such methods of integrating heterogeneous dies with the PM coating provides for high manufacturing reliability resulting in high yields with relatively low production costs for high performance system-in-package devices. In some embodiments, an interconnect structure may be formed on a core substrate and then attached to the redistribution structure. By forming more of the routing within the redistribution structure rather than within the interconnect structure, the electrical performance of the device package may be improved and the overall manufacturing cost of the device package may be reduced. Such methods of manufacture provide for high manufacturing reliability resulting in high yields of high performance package structures with relatively high functional density and low production cost.

FIGS. 1A through 8 illustrate cross-sectional views of intermediate steps of forming an integrated fan-out (InFO) device (e.g., InFO device 100), in accordance with some embodiments.

With reference now to FIG. 1A, there is shown a carrier substrate 102 on which one or more die attach pads 103, have been placed, in accordance with some embodiments. The carrier substrate 102 may include, for example, silicon-based materials, such as a silicon substrate (e.g., a silicon wafer), a glass material, silicon oxide, or other materials, such as aluminum oxide, a plastic material, an organic material, the like, or a combination. The carrier substrate 102 may be planar in order to accommodate an attachment of devices.

In some embodiments, the die attach pads 103 may comprises a release layer (not shown) to facilitate subsequent de-bonding of the carrier substrate 102. The die attach pads 103 may be formed of a polymer-based material, which may be removed along with the carrier substrate 102 from the overlying structures that will be formed in subsequent steps. According to some embodiments, the die attach pads 103 may be of suitable sizes and shapes for attaching the respective overlying structures. In some embodiments, the die attach pads 103 comprise an adhesive, which loses its adhesive property when heated or when exposed to light (e.g., epoxy-based thermal-release materials, Light-to-Heat-Conversion (LTHC) release coatings, ultra-violet (UV) glue, or the like). In other embodiments, the die attach pads 103 comprise a solder resist ink. The die attach pads 103 may be dispensed as a liquid and cured, may be a laminate film laminated onto the carrier substrate 102, may be an ink jet printed or screen printed onto the carrier substrate 102, or the like. The top surfaces of the die attach pads 103 may be leveled and may have a high degree of co-planarity. According to some embodiments, the die attach pads 103 are formed to a first thickness Th1 of between about 1 μm and about 50 μm, such as about 5 μm.

Figure 2A:
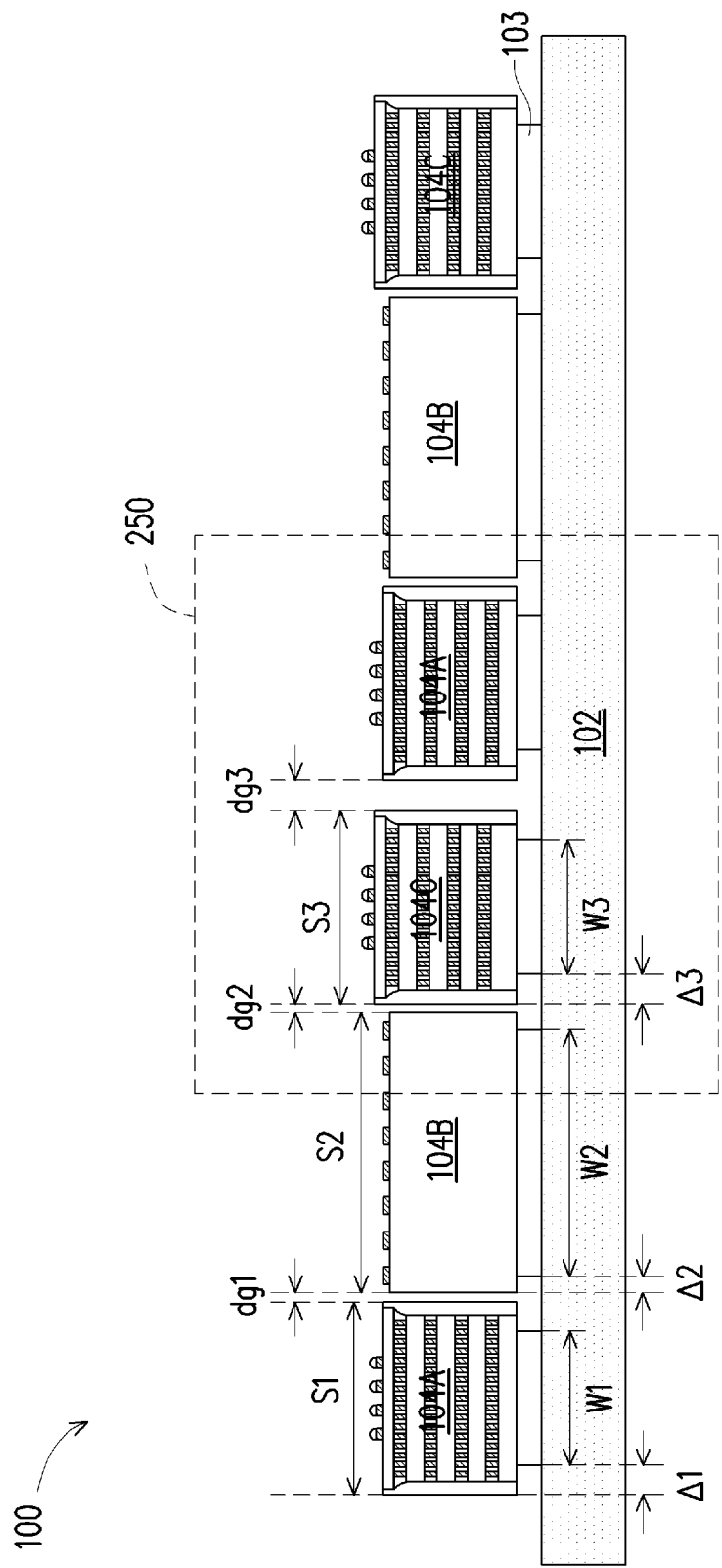
Figure 2B:
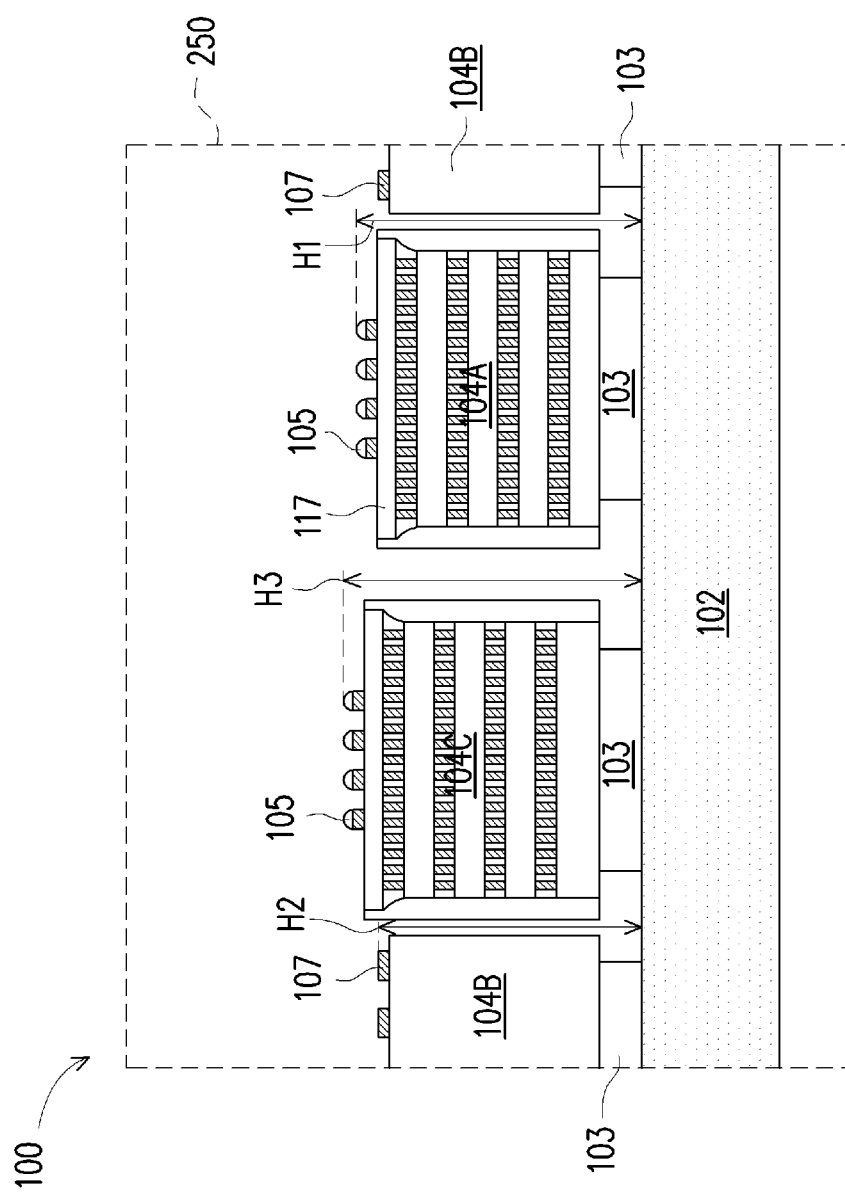

With reference to FIGS. 2A and 2B, semiconductor devices 104A-C are placed on the die attach pads 103 over the carrier substrate 102 using a suitable process such as a pick-and-place process. Each of the semiconductor devices 104A-C shown in these figures may be a semiconductor device designed for an intended purpose such as a memory die (e.g., a high bandwidth memory (HBM) stack, a stacked memory die, a DRAM die, etc.), a logic die, a central processing unit (CPU) die, a system-on-a-chip (SoC), the like, or a combination thereof. The semiconductor devices 104A-C may include integrated circuit devices, such as transistors, capacitors, inductors, resistors, metallization layers, external connectors, and the like, therein, as desired for a particular functionality. In some embodiments, the semiconductor devices 104A-C comprise more than one of the same type of device, or may include different devices.

In embodiments in which the semiconductor device 104C is a high bandwidth memory (HBM) stack, the semiconductor device 104C may comprise a stack of separate semiconductor dies. For example, the stack of separate semiconductor dies may be a stack of memory dies (e.g., a memory cube) which are all stacked on top of a buffer die, which may be a controller die to help to control and interconnect the individual dies within the stack. Additionally, once the stack has been formed, the stack may be encapsulated with an encapsulant (not separately labeled), FIG. 2A shows two sets of three semiconductor devices 104A-C, according to an embodiment; however, any suitable number of semiconductor devices may be placed on the carrier substrate 102. According to some embodiments, the semiconductor devices 104A-C have different sizes such as a first size S1, a second size S2 and a third size S3, respectively and may comprise different types of external contacts. In some embodiments, first semiconductor devices (e.g., 104A) are separated from second semiconductor devices (e.g., 104B) by a first die gap (dg1), the second semiconductor devices (e.g., 104B) are separated from third semiconductor devices (e.g., 104C) by a second die gap (dg2), and the third semiconductor devices (e.g., 104C) are separated from the first semiconductor devices (e.g., 104A) by a third die gap (dg3). The die gaps (dg1, dg2, and dg3) may be equidistant or may be different distances. According to some embodiments, the die gaps (dg1, dg2, and dg3) are between about 25 μm and about 500 μm, such as about 75 μm. However, any suitable distances may be used.

Furthermore, the die attach pads 103 are formed to suitable dimensions such as a first width W1, a second width W2, and a third width W3 that correspond to the sizes (S1, S2, and S3) of the semiconductor devices 104A-C to which they attach, respectively. FIG. 2A further illustrates that the die attach pads 103 are dimensioned and the semiconductor devices 104A-C are arranged over and attached to the die attach pads 103 such that the semiconductor devices 104A-C have overhang margins (e.g., A1, A2, A3) between outer perimeters of the semiconductor devices 104A-C and outer perimeters of the die attach pads 103 to which they attach, respectively. For example, the first semiconductor devices (e.g., 104A) have first overhang margins (A1), the second semiconductor devices (e.g., 104B) have second overhang margins (A2), and the third semiconductor devices (e.g., 104C) have third overhang margins (A3). According to some embodiments, the first overhang margin A1 can be between about 2 μm and about 75 μm, such as about 5 μm, the second overhang margin A2 can be between about 2 μm and about 75 μm, such as about 5 μm, and the third overhang margin A3 can be between about 2 μm and about 75 μm, such as about 5 μm. However, any suitable distances may be used for the overhang margins.

FIG. 2B illustrates a magnified view of the first region 250 highlighted in FIG. 2A. According to some embodiments, the semiconductor devices 104A-C may have different types of external contacts and may have different heights. For example, the first and third semiconductor devices (e.g., 104A and 104C) may have external contacts comprising solder material (e.g., micro-bumps of first device contacts 105) and the second semiconductor devices (e.g., 104B) may have external contacts comprising contact pads (e.g., second device contacts 107), although the external contacts of the semiconductor devices 104A-C may be the same. As a further example, the first semiconductor devices (e.g., 104A) may have a first height H1, the second semiconductor devices (e.g., 104B) may have a second height H2 different from the first height H1, and the third semiconductor devices (e.g., 104C) may have a third height H3 different from the first height H1 and the second height H2, although the heights may be the same. According to some embodiments, the first height H1 can be between about 695 μm and about 745 μm, such as about 720 μm, the second height H2 can be between about 700 μm and about 740 μm, such as about 720 μm, and the third height H3 can be between about 695 μm and about 745 μm, such as about 720 μm. However, any suitable heights may be utilized.

Figure 3A:
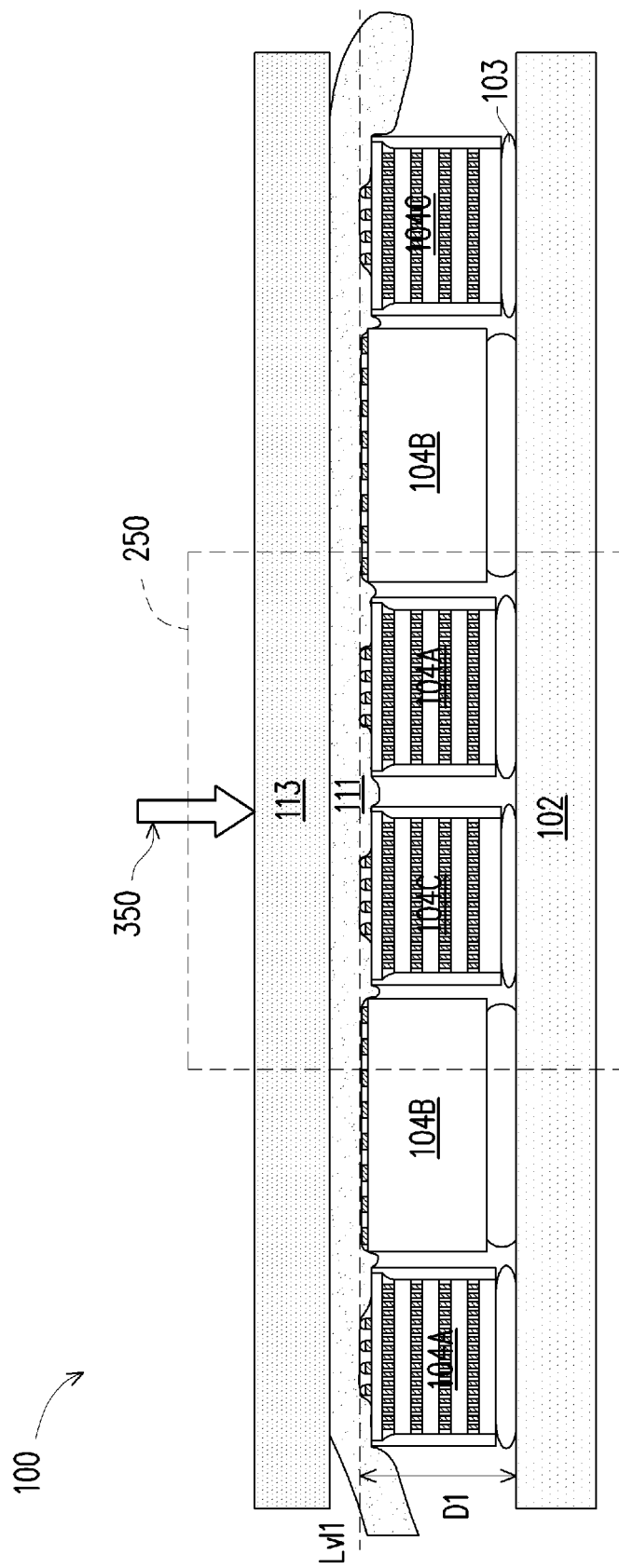
Figure 3B:
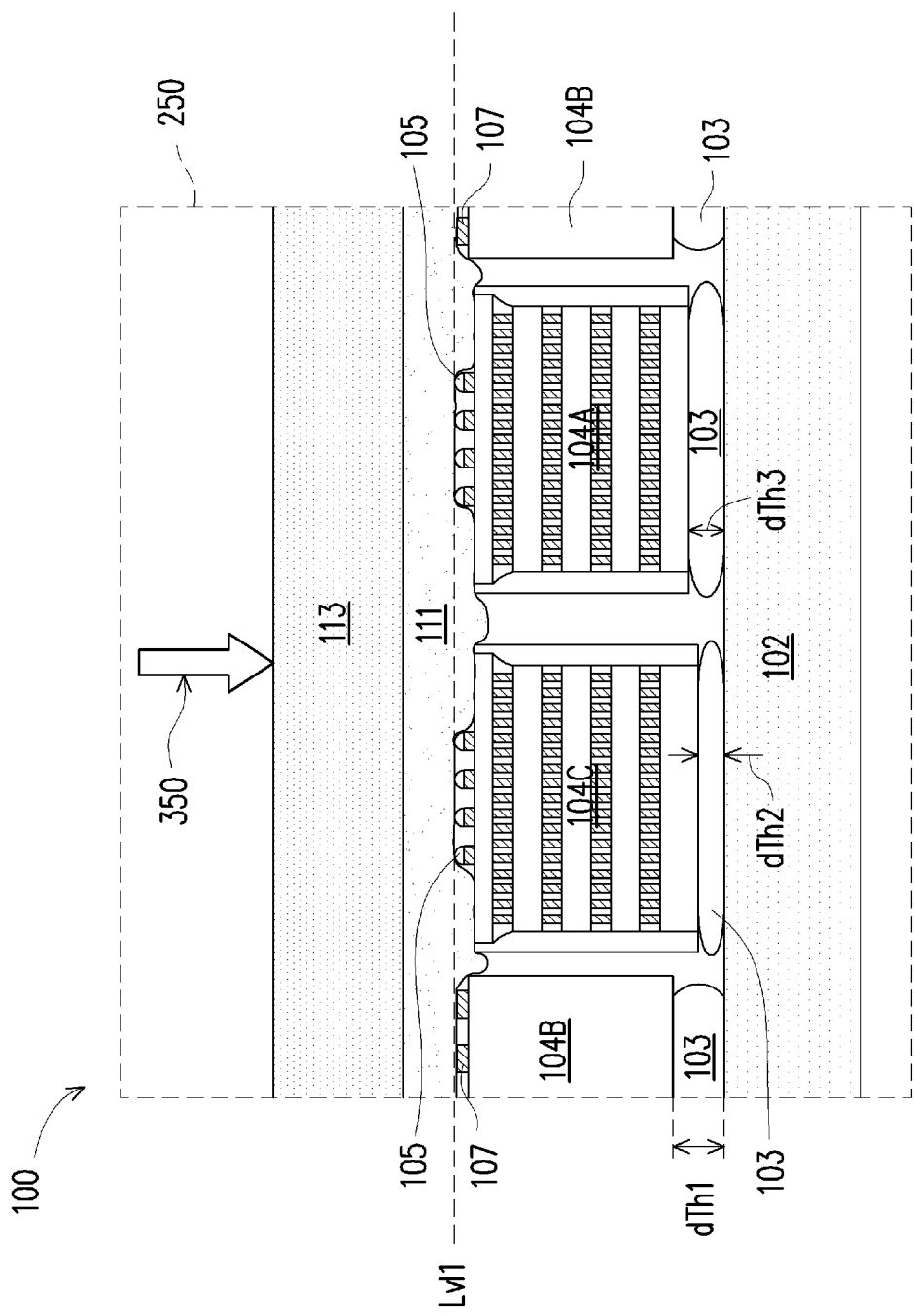

FIGS. 3A and 3B illustrate a leveling process 350 using a flattening tool 113 to align tops of the first device contacts 105 and the second device contacts 107 of the semiconductor devices 104A-C at a first level Lvl1 and further adhere the semiconductor devices 104A-C to the carrier substrate 102. According to some embodiments, the flattening tool 113 uses a leveling film 111 (e.g., leveling foil) that is placed in contact with the first device contacts 105 and the second device contacts 107 and upper surfaces of the semiconductor devices 104A-C. Once the leveling film 111 is placed, the leveling process 350 may be conducted at a process temperature at or above a melting point of the die attach pads 103 while a downward force (indicated by the directional arrow 350) is applied to the flattening tool 113 to deform the die attach pads 103 such that the semiconductor devices 104A-C are bonded to the substrate and the first device contacts 105 and the second device contacts 107 of the semiconductor devices 104A-C are aligned with the first level Lvl1 at a first distance D1 above the carrier substrate 102. According to some embodiments, the process temperature is between about 50° C. and about 200° C., such as about 110° C. and the first distance D1 of the first level Lvl1 is between about 735 μm and about 795 μm, such as about 765 μm. However, any suitable distances may be used.

Due to the overhang margins (e.g., Δ1, Δ2, Δ3 in FIG. 2A) between outer perimeters of the semiconductor devices 104A-C and outer perimeters of the die attach pads 103, little to no material of the deformed die attach pads 103 extends beyond the perimeters of the semiconductor devices 104A-C into the die gaps (dg1, dg2, and dg3). As such, during the leveling process 350, no ink protrusion and no die shifting occur due to excess material of the deformed die attach pads 103 extending into the die gaps (dg1, dg2, and dg3) and interfering with the leveling process 350. FIG. 3A further illustrates the first region 250 of the structure during the leveling process 350.

FIG. 3B illustrates a magnified view of the first region 250 highlighted in FIG. 3A. According to some embodiments, due to the different heights of the semiconductor devices 104A-C, the die attach pads 103 may be deformed during the leveling process 350 to different thicknesses. For example, the die attach pads 103 attaching the first semiconductor devices (e.g., 104A) may be deformed from the first thickness Th1 to a first deformed thickness dTh1, the die attach pads 103 attaching the second semiconductor devices (e.g., 104B) may be deformed from the first thickness Th1 to a second deformed thickness dTh2 different from the first deformed thickness dTh1, and the die attach pads 103 attaching the third semiconductor devices (e.g., 104C) may be deformed from the first thickness Th1 to a third deformed thickness dTh3 different from the first deformed thickness dTh1 and the second deformed thickness dTh2, although the thicknesses may also be the same. According to some embodiments, the first thickness dTh1 can be deformed to a thickness of between about 1 μm and about 50 μm, such as about 5 μm, the second thickness dTh2 can be deformed to a thickness of between about 1 μm and about 50 μm, such as about 5 μm, and the third thickness dTh3 can be deformed to a thickness of between about 1 μm and about 50 μm, such as about 5 μm. However, any suitable thicknesses may be utilized for the deformed thicknesses.

By separating the die attach pads 103 from each other, the heights of the semiconductor devices 104A-C can be decoupled from each other and handled separately without the separation interfering with the other semiconductor devices 104A-C.

Figure 4A:
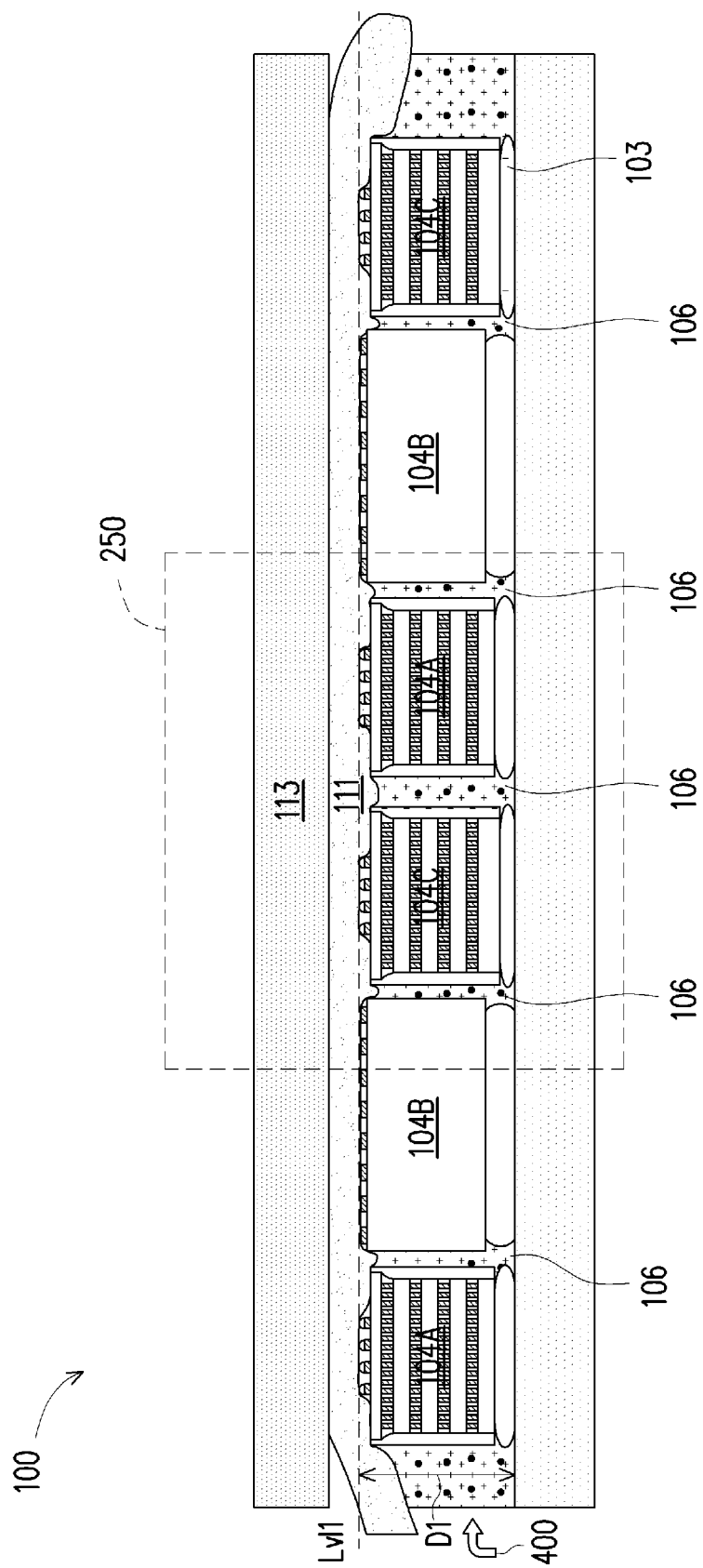
Figure 4B:
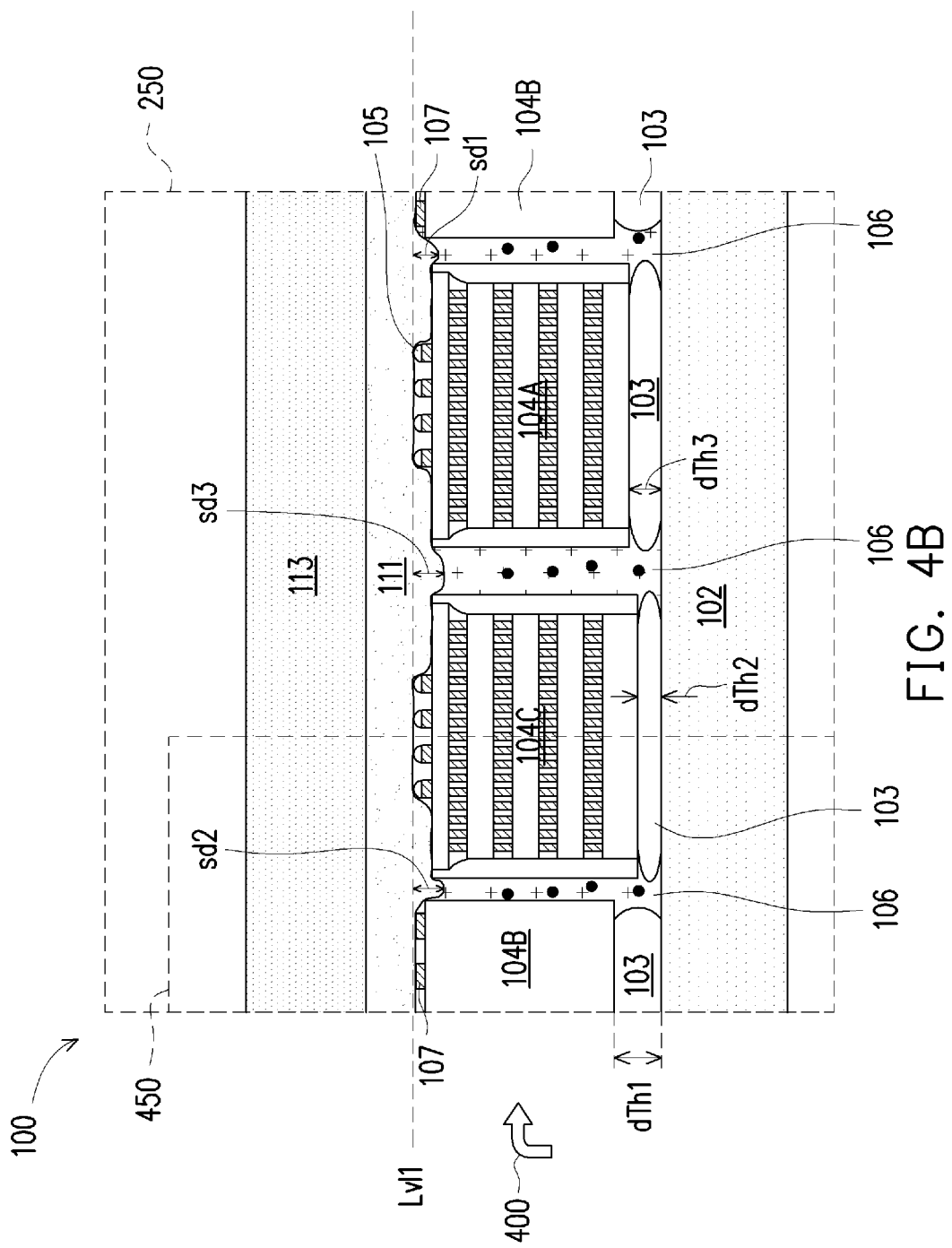

FIGS. 4A-4B illustrate an encapsulation process 400 (indicated by the directional arrow) of the semiconductor devices 104A-C using an encapsulant 106, in accordance with some embodiments. Once the semiconductor devices 104A-C are aligned, the flattening tool 113 may be used as a component of a molding device (not separately shown) used, for example, in a transfer molding technique. The leveling film 111 is used to form a seal over the upper surfaces and the first device contacts 105 and the second device contacts 107 of the semiconductor devices 104A-C. FIGS. 4A-4B further illustrate that the seal formed by the leveling film 111 also extends into the die gaps (e.g., dg1, dg2, dg3) between the semiconductor dies 104A-C. As such, the leveling film 111 prevents the first device contacts 105 and the second device contacts 107 from being embedded in the encapsulant 106 during the encapsulation process 400. According to some embodiments, the leveling film 111 extends into the die gaps (e.g., dg1, dg2, dg3) to sealing depths (e.g., sd1, sd2, and sd3) below the first level Lvl1. The sealing depths may be equal depths or may be different depths. According to some embodiments, the sealing depths (e.g., sd1, sd2, sd3) are depths ranging between about 30 μm and about 150 μm, such as about 50 μm.

Once the first device contacts 105 and the second device contacts 107 have been sealed, the encapsulant 106 may be applied by transfer molding, compression molding, or the like. The encapsulant 106 is formed over the carrier substrate 102 and in gap regions between the semiconductor dies 104A-C such that the semiconductor dies 104A-C are embedded by the encapsulant 106 up to points at which the encapsulant interfaces the leveling film 111. The encapsulant 106 may be applied in liquid or semi-liquid form and then subsequently cured. The encapsulant 106 may be a molding compound such as a resin, polyimide, PPS, PEEK, PES, another material, the like, or a combination thereof. However, other suitable encapsulation techniques and materials may also be used.

Figure 5:
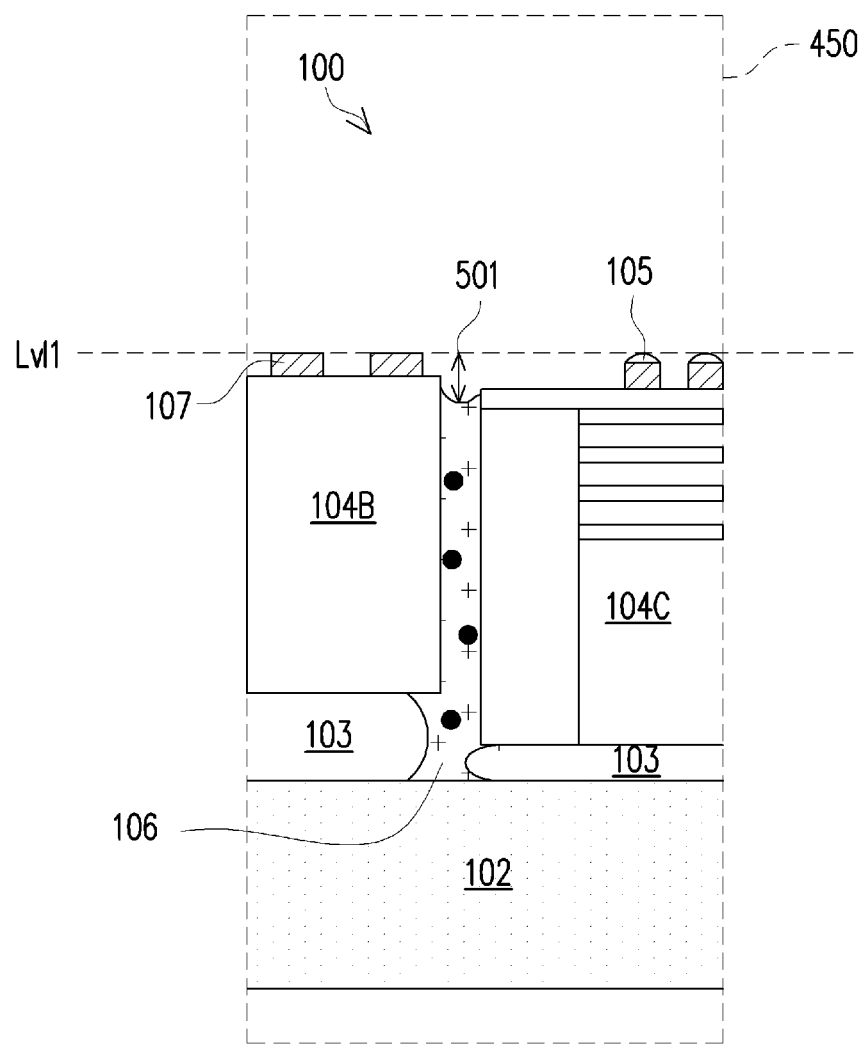

FIG. 5 illustrates a magnified view of the second region 450 of the structure after the encapsulation process 400 has completed and the flattening tool 113 and leveling film 111 have been removed. FIG. 5 illustrates the encapsulant 106 embedding the die attach pads 103 and the semiconductor dies 104B-C from the carrier substrate 102 to points below the first level Lvl1. FIG. 5 further illustrates recesses 501 formed in the encapsulant at the points where the leveling film 111 interfaced with the encapsulant 106 during the encapsulation process 400, wherein the bottoms of the recesses 501 are formed at distances below the first level Lvl1. According to some embodiments, the bottoms of the recesses 501 are formed at the second sealing depth sd2 (see FIG. 4B). However, any suitable distances may be used.

Figure 6:
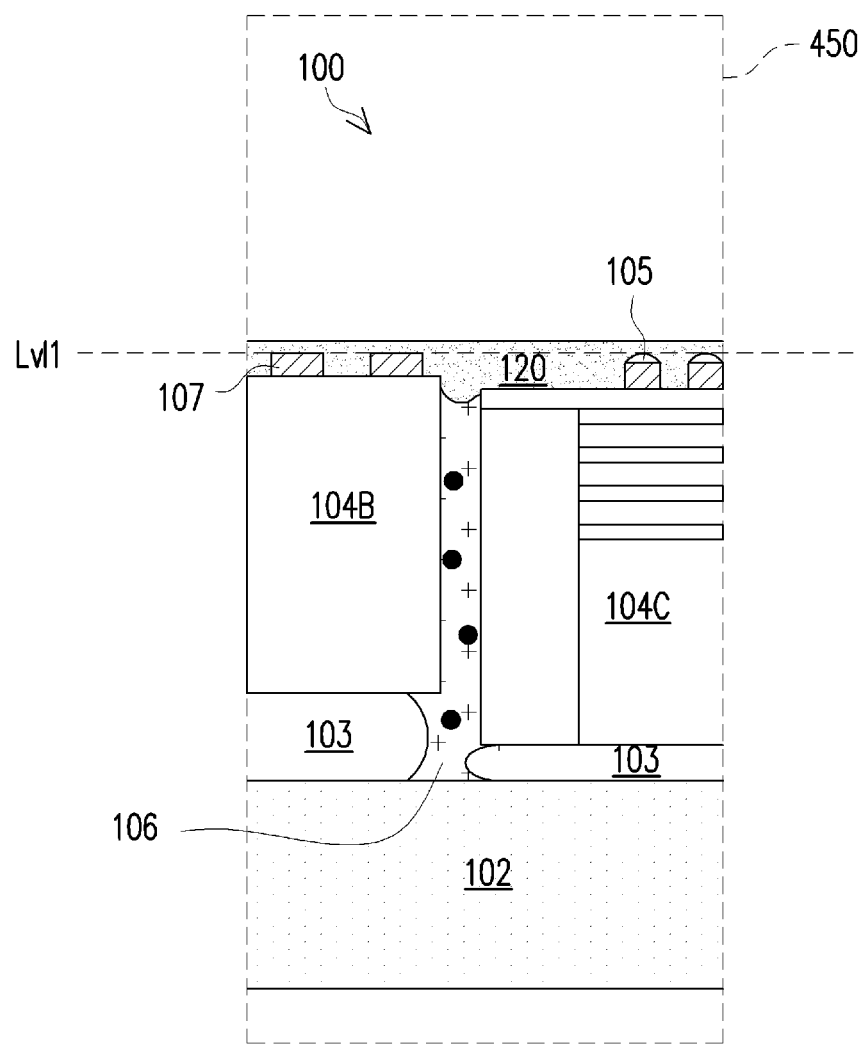

FIG. 6 illustrates the formation of a protective coating 120 over the encapsulant 106 and over the upper surfaces of the first device contacts 105 and the second device contacts 107 of the semiconductor device 104A-C to a level at or above the first level Lvl1. As such, the protective coating 120 fills the recess 501 formed in the encapsulant 106 during the encapsulation process 400. According to some embodiments, the materials of the protective coating 120 are selected to thermal and stressful elongation properties that are greater than the encapsulant 106 (which may have, e.g., an elongation of zero). For example, in some embodiments the protective coating 120 may have a thermal expansion property that is at least 75% greater than the thermal expansion property of the encapsulant 106. However, any suitable improvement in properties may be utilized.

In some embodiments the protective coating 120 may be formed from one or more suitable dielectric materials such as a polyimide material, an oxide (e.g., silicon oxide), a nitride (e.g., silicon nitride), a polymer material (e.g., a photosensitive polymer material), a low-k dielectric material, another dielectric material, the like, or a combination thereof. The protective coating 120 can be formed using a deposition process such as spin coating, lamination, CVD, the like, or a combination thereof. However, any suitable insulating materials and any suitable deposition processes may be used to form the protective coating 120.

Figure 7:
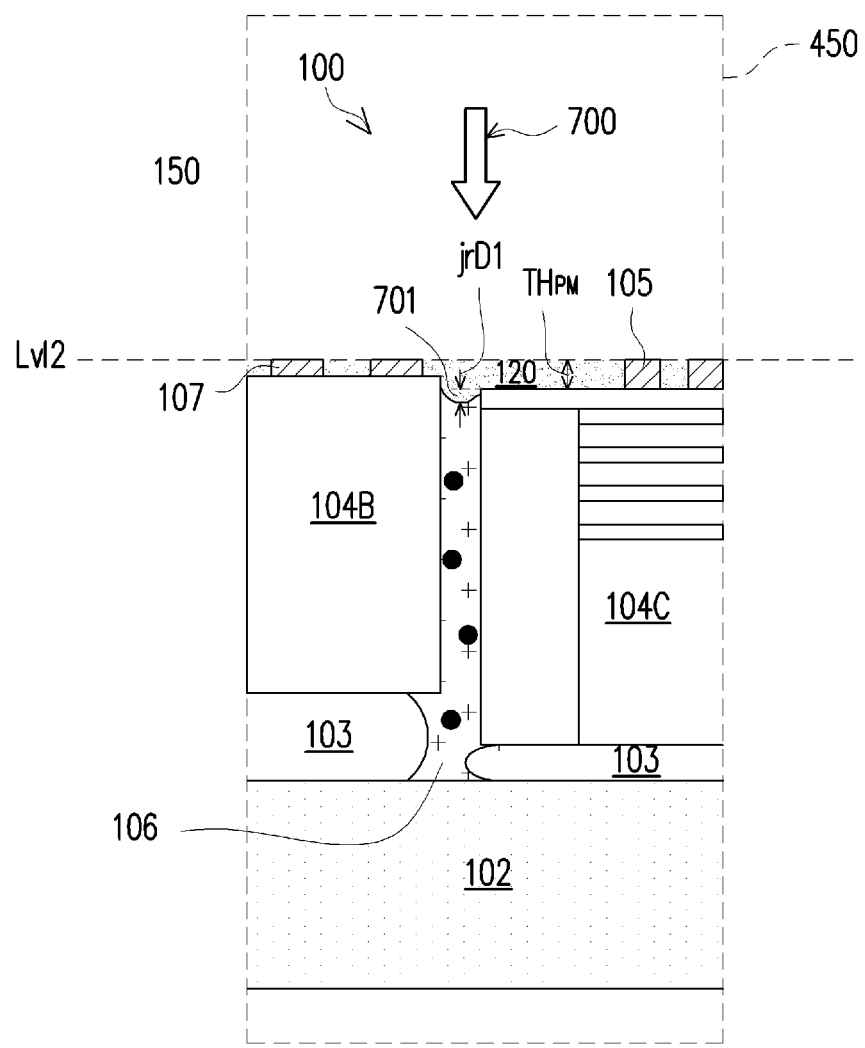

FIG. 7 illustrates a grinding process 700 used to thin the protective coating 120 and to expose the external contacts of the semiconductor devices 104A-C, in accordance with some embodiments. The protective coating 120 and the external contacts (e.g., the first device contacts 105 and the second device contacts 107) of the semiconductor devices 104A-C may be reduced to a second level Lvl2 at or below the first level Lvl1. In some embodiments, the second device contacts 107 may be reduced to a thickness of between about 0.4 μm and about 10 μm. As such, in some embodiments, the solder material (e.g., micro-bumps of the first device contacts 105, if present) is removed from the external contacts of the semiconductor devices 104A-C and the external contacts (e.g., first device contacts 105 and the second device contacts 107) are exposed through the protective coating 120.

FIG. 7 further illustrates the protective coating 120 comprising protective joints 701 formed within the recesses 501 of the encapsulant 106. According to some embodiments, once the protective coating 120 has been reduced to the second level Lvl2, the protective coating 120 has a thickness $Th_{PM}$ between the semiconductor devices 104A-C and the second level Lvl2 of between about 3 µm and about 20 µm, such as about 10 µm and the protective joints 701 have a joint recess depth (jrD1) ranging from between about 0 µm and about 20 µm, such as about 10 µm.

Due to the added thickness of the protective joints 701 and due to the material characteristics (e.g., elasticity, rigidity, tensile strength, etc.) of the protective coating 120, the protective coating 120 provides a buffer to absorb stresses (e.g., die-to-die corner area stress) during further processing such as grinding, torturing by reliability stress, wafer warpage and/or component warpage during multi-reflow and/or thermal cycling. As such, the protective coating 120 can absorb stresses imparted by the corners of the semiconductor devices 104A-C to the areas between the die gaps (e.g., dg1, dg2, and dg3) during further wafer processing, thereby increasing the integration reliability window of the manufacturing process. As such, fine line crack failures in these processes that had previously been induced by the molding compound cracking and then propagating into overlying layers, can be reduced or eliminated.

Figure 8:
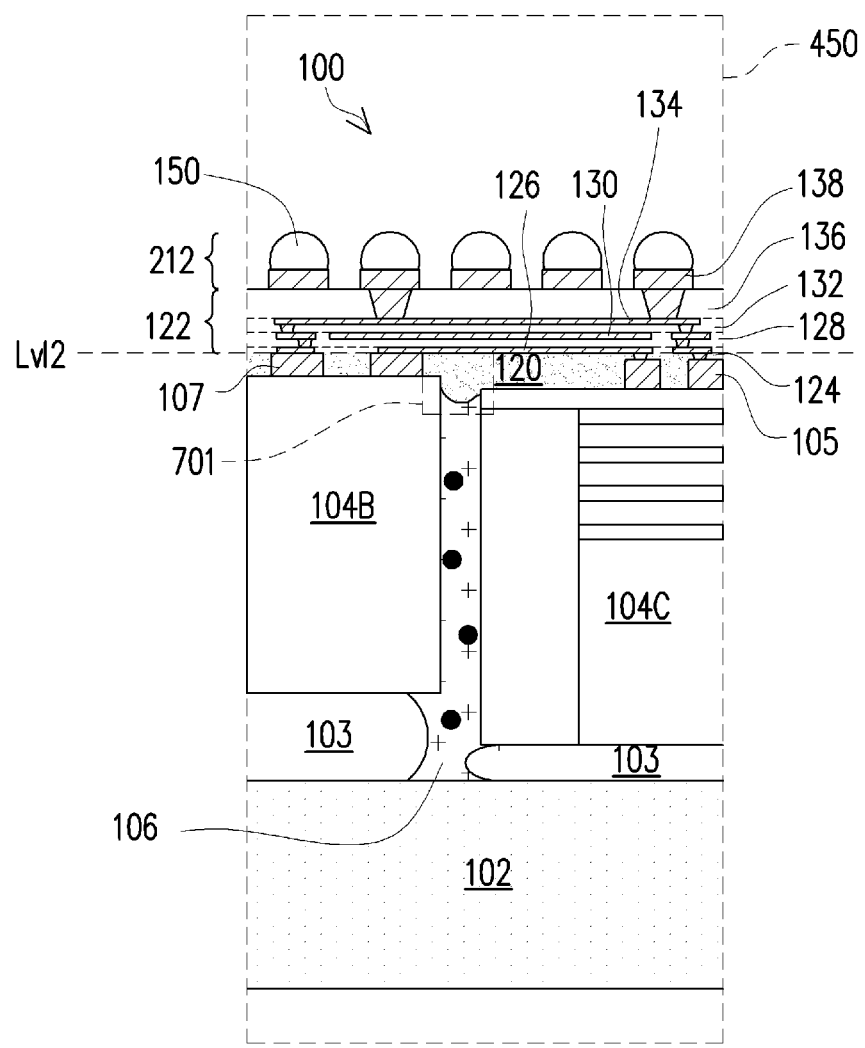

FIG. 8 illustrates the formation of a front-side redistribution structure 122, according to some embodiments. The front-side redistribution structure 122 comprises dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated. The front-side redistribution structure 122 may also be referred to herein as an integrated fan-out (InFO) structure.

In FIG. 8, the first dielectric layer 124 is deposited over the protective coating 120, the semiconductor devices 104A-C, and the external contacts (e.g., first device contacts 105 and the second device contacts 107) that are exposed through the protective coating 120. In some embodiments, the first dielectric layer 124 is formed of a photo-sensitive material such as PBO, polyimide, BCB, or the like, which may be patterned using a lithography mask. The first dielectric layer 124 may be formed by spin coating, lamination, CVD, the like, or a combination thereof. The first dielectric layer 124 is then patterned. The patterning forms openings exposing portions of the external contacts of the semiconductor devices 104A-C (e.g., first device contacts 105 and the second device contacts 107). The patterning may be by an acceptable process, such as by exposing the first dielectric layer 124 to light when the first dielectric layer 124 is a photo-sensitive material or by etching using, for example, an anisotropic etch. If the first dielectric layer 124 is a photo-sensitive material, the first dielectric layer 124 can be developed after the exposure.

The first metallization pattern 126 is then formed. The first metallization pattern 126 includes line portions (also referred to as conductive lines) on and extending along the major surface of the first dielectric layer 124. The first metallization pattern 126 further includes via portions (also referred to as conductive vias) extending through the first dielectric layer 124 to physically and electrically couple the semiconductor devices 104A-C to the first metallization pattern 126. As an example to form the first metallization pattern 126, a seed layer is formed over the first dielectric layer 124 and in the openings extending through the first dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the first metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the first metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Once the first metallization pattern 126 has been deposited, the second dielectric layer 128 is deposited on the first metallization pattern 126 and the first dielectric layer 124. The second dielectric layer 128 may be formed in a manner similar to the first dielectric layer 124, and may be formed of a similar material as the first dielectric layer 124.

The second metallization pattern 130 is then formed. The second metallization pattern 130 includes line portions on and extending along the major surface of the second dielectric layer 128. The second metallization pattern 130 further includes via portions extending through the second dielectric layer 128 to physically and electrically couple the first metallization pattern 126. The second metallization pattern 130 may be formed in a similar manner and of a similar material as the first metallization pattern 126. In some embodiments, the second metallization pattern 130 has a different size than the first metallization pattern 126. For example, the conductive lines and/or vias of the second metallization pattern 130 may be wider or thicker than the conductive lines and/or vias of the first metallization pattern 126. Furthermore, the second metallization pattern 130 may be formed to a greater pitch than the first metallization pattern 126.

Once the second metallization pattern 130 has been deposited, the third dielectric layer 132 is deposited on the second metallization pattern 130 and second dielectric layer 128. The third dielectric layer 132 may be formed in a manner similar to the first dielectric layer 124, and may be formed of a similar material as the first dielectric layer 124.

The third metallization pattern 134 is then formed. The third metallization pattern 134 includes line portions on and extending along the major surface of the third dielectric layer 132. The third metallization pattern 134 further includes via portions extending through the third dielectric layer 132 to physically and electrically couple the second metallization pattern 130. The third metallization pattern 134 may be formed in a similar manner and of a similar material as the first metallization pattern 126. The third metallization pattern 134 is the topmost metallization pattern of the front-side redistribution structure 122. As such, all of the intermediate metallization patterns of the front-side redistribution structure 122 (e.g., the first metallization pattern 126 and the second metallization pattern 130) are disposed between the third metallization pattern 134 and the protective coating 120. In some embodiments, the third metallization pattern 134 has a different size than the first metallization pattern 126 and the second metallization pattern 130. For example, the conductive lines and/or vias of the third metallization pattern 134 may be wider or thicker than the conductive lines and/or vias of the first metallization pattern 126 and the second metallization pattern 130. Furthermore, the third metallization pattern 134 may be formed to a greater pitch than the second metallization pattern 130.

FIG. 8 further illustrates the deposition of the fourth dielectric layer 136 over the third metallization pattern 134 and the third dielectric layer 132. The fourth dielectric layer 136 may be formed in a manner similar to the first dielectric layer 124, and may be formed of a similar material as the first dielectric layer 124. The fourth dielectric layer 136 is the topmost dielectric layer of the front-side redistribution structure 122. As such, all of the metallization patterns of the front-side redistribution structure 122 (e.g., the metallization patterns 126, 130, and 134) are disposed between the fourth dielectric layer 136 and the protective coating 120. Furthermore, all of the intermediate dielectric layers of the front-side redistribution structure 122 (e.g., the dielectric layers 124, 128, 132) are disposed between the fourth dielectric layer 136 and the protective coating 120. The fourth dielectric layer 136, according to some embodiments, may be formed to have a large thickness which helps to reduce the mechanical stress exerted on the metallization patterns 126, 130, and 134 when the front-side redistribution structure 122 is attached to another substrate. However, the fourth dielectric layer 136 may be formed to have a same or similar thickness as that of the other dielectric layers 124, 128, 132 of the front-side redistribution structure 122.

Once the fourth dielectric layer 136 has been deposited, first external connectors 212 are formed for external connection to the front-side redistribution structure 122. According to some embodiments, the first external connectors 212 comprise UBMs 138 and conductive connectors 150. The UBMs 138 are located on and extending along the major surface of the fourth dielectric layer 136, and have via portions extending through the fourth dielectric layer 136 to physically and electrically couple the third metallization pattern 134. As a result, the UBMs 138 are electrically coupled to the semiconductor devices 104A-C. The UBMs 138 may be formed by patterning the fourth dielectric layer 136 to form openings exposing portions of the third metallization pattern 134. The patterning may be by an acceptable process, such as by exposing the fourth dielectric layer 136 to light when the fourth dielectric layer 136 is a photo-sensitive material or by etching using, for example, an anisotropic etch. If the fourth dielectric layer 136 is a photo-sensitive material, the fourth dielectric layer 136 can be developed after the exposure.

Once the fourth dielectric layer 136 has been patterned, the UBMs 138 are formed over the fourth dielectric layer 136 and in the patterned openings of the fourth dielectric layer 136. In some embodiments, the UBMs 138 comprise a metal seed layer, which may be a single layer or a composite layer comprising a plurality of sub-layers formed of different materials (e.g., a titanium layer and a copper layer over the titanium layer) using, for example, a physical vapor deposition (PVD) process or the like. The UBMs 138 comprise a conductive material that is formed over the seed layer (if provided). A photoresist may be deposited by spin coating or the like and then patterned (e.g., by exposing to light) such that openings in the photoresist correspond to the UBMs 138. Once the photoresist has been patterned, the conductive material is formed in the openings of the photoresist corresponding to the UBMs 138. The conductive material comprises a metal (e.g., copper, titanium, tungsten, aluminum, alloys thereof, combinations thereof, or the like) and may be formed by plating (e.g., electroplating or electroless plating, or the like). Then, the photoresist is removed (e.g., via ashing or stripping process, such as using an oxygen plasma or the like) and exposed portions of the seed layer (if provided) not covered by the conductive material are removed (e.g., by using an acceptable etching process, such as by wet or dry etching). As such, the UBMs 138 are formed over and through patterned openings in the fourth dielectric layer 136 and in contact with the third metallization pattern 134. In other embodiments where the UBMs 138 are formed differently, more photoresist and patterning steps may be utilized. Furthermore, the UBMs 138 may be formed with any suitable thicknesses (e.g., in the range of about 10 µm to about 40 µm, such as about 30 µm) and with any suitable widths such that the mechanical stress exerted on the third metallization pattern 134 is reduced. As such, the various thicknesses and widths of the UBMs 138 allow the mechanical reliability of the front-side redistribution structure 122 to be increased.

FIG. 8 further illustrates conductive connectors 150 that are formed on the UBMs 138. The conductive connectors 150 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 150 may include a conductive material such as solder, copper, aluminum, gold, nickel, silver, palladium, tin, the like, or a combination thereof. In some embodiments, the conductive connectors 150 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 150 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. According to some embodiments, the InFO device 100 may be embedded in a second encapsulant (not shown) from the carrier substrate 102 to the fourth dielectric layer 136 while leaving the conductive connectors 150 exposed.

Then, a carrier substrate de-bonding is performed to detach (or "de-bond") the carrier substrate 102 from the back-side of the structure illustrated in FIG. 8, e.g., the coplanar surfaces of the die attach pads 103 and the encapsulant 106. In accordance with some embodiments, the de-bonding includes projecting a light such as a laser light or an UV light on the die attach pads 103 so that the die attach pads 103 decompose under the heat of the light and the carrier substrate 102 can be removed entirely. Once the carrier substrate 102 has been removed, a grinding process or a chemical mechanical planarization (CMP) process is used to remove the die attach pads 103 and to expose the semiconductor dies 104B-C.

By using the leveling film 111 to prevent the encapsulant 106 from extending over the semiconductor devices 104A-C, and also preventing the encapsulant 106 from completely filling the region between the semiconductor devices 104A-C, the protection coating 120 may be used to fill these regions. Accordingly, because the protection coating 120 has better protective properties that can better withstand the stresses that occur in later processes, the presence of the protection layer 120 can better protect those regions. As such, cracks and other defects that can occur during subsequent manufacturing can be reduced or eliminated, thereby increasing the overall yield of the manufacturing process.

Figure 9:
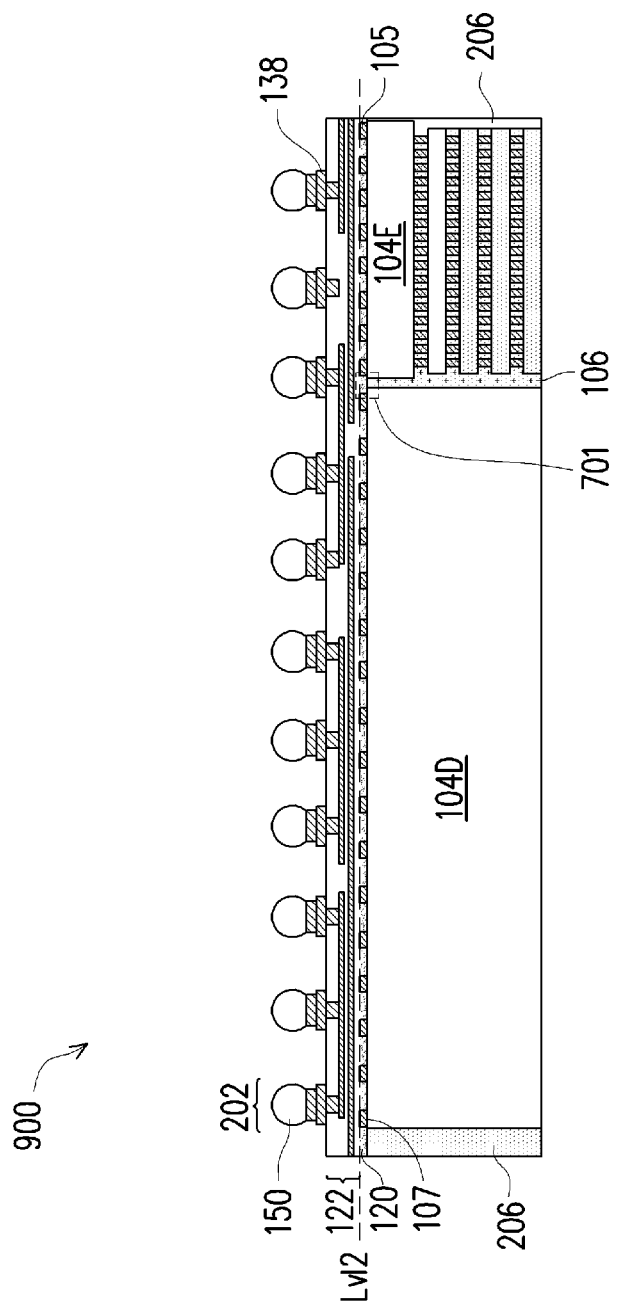
FIG. 9 illustrates a cross-sectional view of an integrated fan-out device, in accordance with some other embodiments.

FIG. 9 illustrates a cross-sectional view of a second InFO device 900, according to other embodiments. The second InFO device 900 may be formed using any of the materials and any of the processes set forth above for forming the InFO device 100. According to an embodiment, the second InFO device 900 comprises, for example, a pair of semiconductor devices embedded within a second encapsulant 206, although, any suitable number of semiconductor devices may be utilized. The pair of semiconductor devices 104D-E may be a pair of semiconductor devices designed for an intended purpose such as set forth above with regard to the semiconductor devices 104A-C. According to an embodiment, the pair of semiconductor devices 104D-E comprises, for example, a fourth semiconductor device 104D such as a system-on-a-chip (SoC), and a fifth semiconductor device 104E such as a memory die. However, any suitable semiconductor dies may be used.

FIG. 9 further illustrates the second InFO device 900 comprising the encapsulant 106, the protective coating 120, and the front-side redistribution structure 122 formed as described above with respect to FIGS. 4A-8. The encapsulant 106 fills most of the die gap between the fourth semiconductor device 104D and the fifth semiconductor device 104E. The protective coating 120 extends between the semiconductor devices 104D-10E and comprises the protective joint 701 and is disposed, at the second level Lvl2, over the encapsulant 106, the pair of semiconductor devices 104D-E, and the second encapsulant 206. The front-side redistribution structure 122 is disposed over the protective coating 120 and comprises the UBMs 138 and the conductive connectors 150.

Figure 10A:
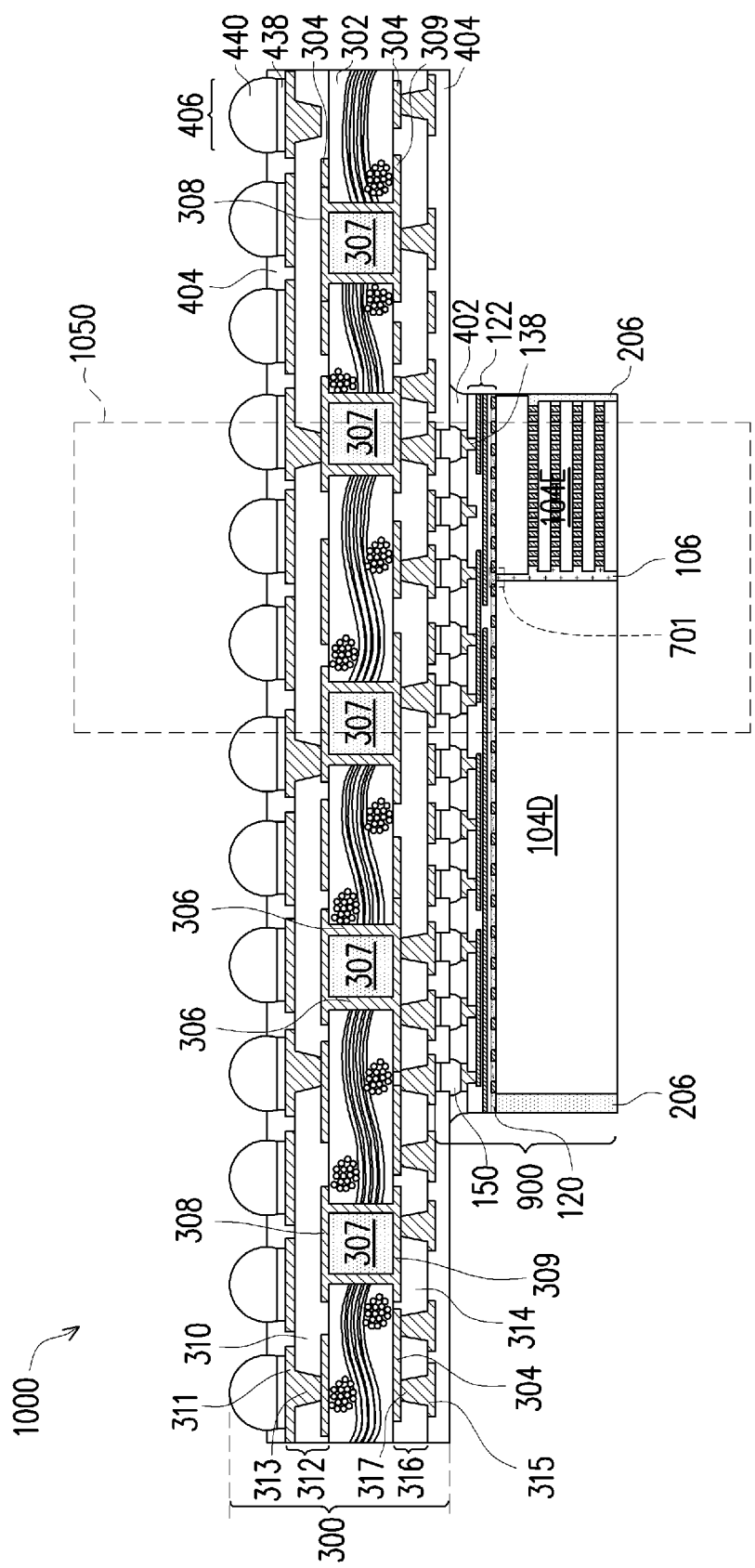
FIGS. 10A and 10B illustrate cross-sectional views of a wafer level package comprising the integrated fan-out device of FIG. 9, in accordance with some embodiments.
Figure 10B:
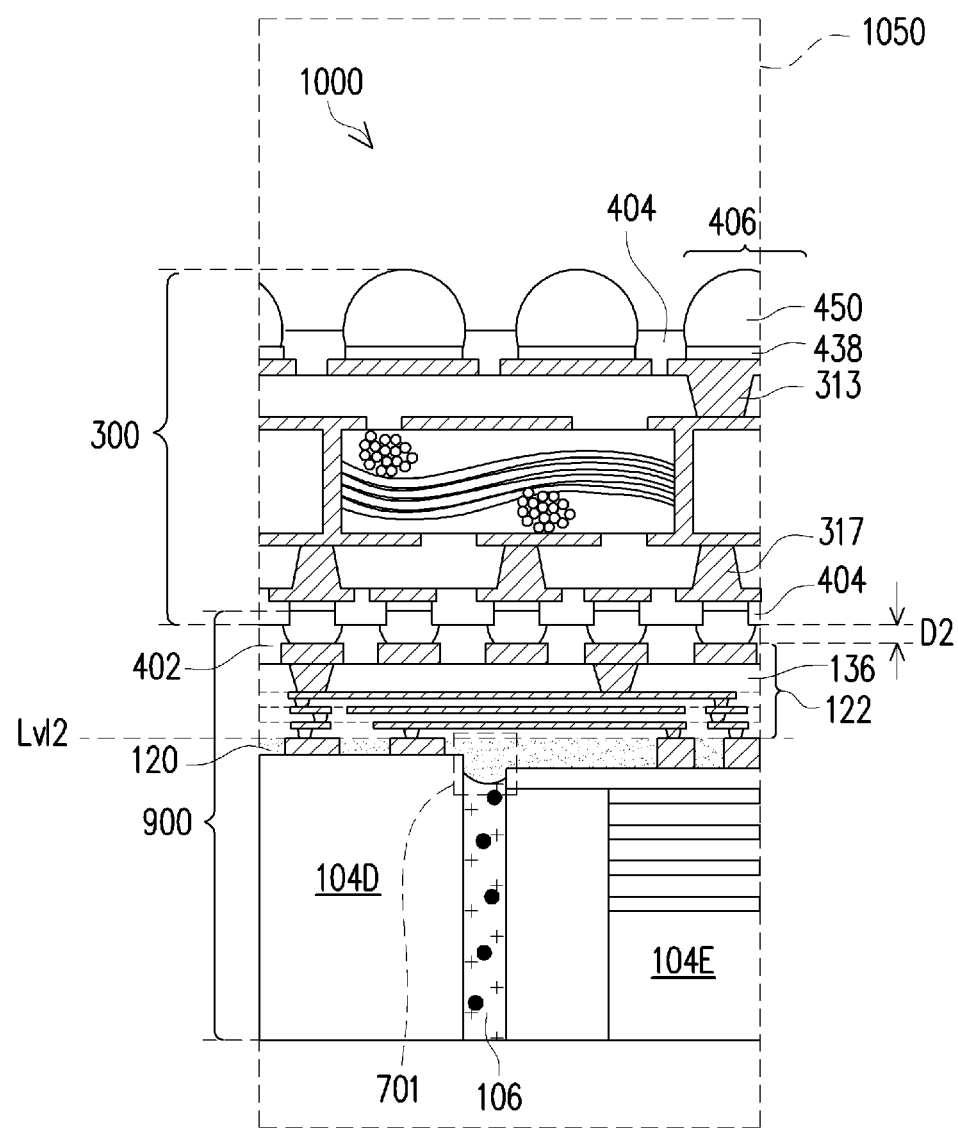

FIGS. 10A and 10B illustrate cross-sectional views of a wafer level package (WLP) 1000 incorporating the second InFO device 900 of FIG. 9 and an interconnect structure 300, in accordance with some embodiments. The interconnect structure 300 is attached to the second InFO device 900 and provides additional electrical routing. The interconnect structure 300 is free of active devices. In some embodiments, the interconnect structure 300 may be, for example, an interposer or a "semi-finished substrate." The interconnect structure 300 can also provide stability and rigidity to an attached device structure (e.g., second InFO device 900), and can reduce warping of an attached device structure.

According to some embodiments, the interconnect structure 300 comprises a core substrate 302 having conductive layers 304 disposed on opposite surfaces. In some embodiments, the core substrate 302 may include a material such as Ajinomoto build-up film (ABF), a pre-impregnated composite fiber (prepreg) material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate 302 may be a double-sided copper-clad laminate (CCL) substrate or the like. The core substrate 302 may have a thickness between about 30 µm and about 2000 µm, such as about 8000 µm or about 1200 µm. The conductive layers 304 may be one or more layers of copper, nickel, aluminum, other conductive materials, the like, or a combination thereof laminated or formed onto opposing sides of the core substrate 302. In some embodiments, the conductive layers 304 may have a thickness between about 1 µm and about 30 µm.

FIG. 10A further illustrates conductive vias 306 formed in the core substrate 302 connecting a first conductive routing layer 308 to a second conductive routing layer 309 through the core substrate 302. The first conductive routing layer 308 is formed in contact with the conductive layer 304 on one side of the core substrate 302 and the second conductive routing layer 309 is formed in contact with the conductive layer 304 on an opposite side of the core substrate 302. Openings in the core substrate 302 for the conductive vias 306 may be formed using any suitable techniques of forming opening in the core substrate 302 (e.g., laser drilling, mechanical drilling, etching, or the like). The conductive layers 304, the conductive vias 306, the first and second conductive routing layers 308 and 309 may be formed using any suitable lithographic materials (e.g., photoresist) and any suitable lithographic processes (e.g., wet chemical etch, dry etch such as ashing) and using any suitable conductive materials and any suitable deposition processes (e.g., plating, electro-less plating, or the like) that are suitable for forming the conductive layers 304, as set forth above. In some embodiments, the material of the conductive vias 306, the first and second conductive routing layers 308 and 309 are deposited to a thickness between about 2 µm and about 50 µm.

In some embodiments, after forming the conductive vias 306 along sidewalls of the openings, the openings may then be filled with a dielectric through via core 307 using a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the dielectric through via core 307 may include pigments or dyes (e.g., for color), or other fillers and additives that modify rheology, improve adhesion, or affect other properties of the dielectric through via core 307. The dielectric through via core 307 may be formed using, e.g., a spin-on process or another process. In some embodiments, the conductive material may completely fill the conductive vias 306, omitting the dielectric through via core 307.

Additional dielectric layers 310 and 314 and additional routing layers 311 and 315 may be formed over the first and second conductive routing layers 308 and 309 to form routing structures 312 and 316. The routing structures 312 and 316 are formed on opposite sides of the core substrate 302 and may provide additional electrical routing within the interconnect structure 300. The routing structures 312 and 316 are electrically connected to the first and second conductive routing layers 308 and 309, respectively. Each of the routing structures 312 and 316 may comprise any suitable number of additional dielectric layers 310 and 314 and any suitable number of additional routing layers 311 and 315, respectively. In some embodiments, one or both of routing structures 312 or 316 may be omitted. In some cases, the number of other additional routing layers 311 and 315 in the routing structures 312 or 316 may be reduced by increasing the number of redistribution layers in the front-side redistribution structure 122 of the attached device structure (e.g., second InFO device 900).

The additional dielectric layers 310 and 314 are formed over the first and second conductive routing layers 308 and 309 using any of the dielectric materials and deposition processes suitable to form the dielectric layers of the core substrate 302, as set forth above. In some embodiments, the additional dielectric layers 310 and 314 may have thicknesses between about 2 µm and about 50 µm. Openings (not shown) are formed in the additional dielectric layers 310 and 314 that expose portions of the first and second conductive routing layers 308 and 309 for subsequent electrical connection. The openings may be formed in the additional dielectric layers 310 and 314 using any of the materials and techniques suitable to form the openings in the core substrate 302, as set forth above. Once exposed, a conductive material is deposited over the additional dielectric layers 310 and 314 to form the additional routing layers 311 and 315 with metallization vias 313 and 317 being formed in contact with the first and second conductive routing layers 308 and 309, respectively. In some embodiments, a conductive layer (not shown) may be formed over the additional dielectric layers 310 and 314, which may act as a seed layer for depositing the conductive material used to form the additional routing layers 311 and 315. The conductive material may be e.g., a metal foil such as a copper foil, or another type of material such as those described above for conductive layers 304. In some embodiments, the conductive material is deposited to form the additional routing layers 311 and 315 to thicknesses between about 2 µm and about 50 µm. As such, the additional routing layers 311 and 315 of the routing structures 312 and 316 may be electrically connected to one another by through the metallization vias 313 and 317 and the conductive vias 306.

In some embodiments, protective layers 404 are first formed over the routing structures 312 and 316. In some embodiments the protective layers 404 are first formed over the routing structures 312 and 316. The protective layers 404 may be formed over second UBMs 438, if present. The protective layers 404 may be formed from one or more suitable dielectric materials such as polybenzoxazole (PBO), a polymer material, a polyimide material, a polyimide derivative, an oxide, a nitride, the like, or a combination thereof. The protective layers 404 may be formed by a process such as spin-coating, lamination, CVD, the like, or a combination thereof. The protective layers 404 may have a thickness of between about 0.5 µm and about 50 µm, such as about 20 µm, although any suitable thickness may be used.

Openings may then be formed in the protective layers 404 to expose portions of the routing structure 312 (which may include the second UBMs 438, if present). The openings in the protective layers 404 may be formed using a suitable technique such as laser drilling or a photolithographic mask and etching process. Once the openings have been formed in the protective layers 404, second external connectors 406 are formed over the exposed portions of the routing structure 312, and make electrical connection to the routing structure 312. According to some embodiments, the second external connectors 406 comprise second UBMs 438 and second conductive connectors 440. In some embodiments, the second UBMs 438 are formed on the routing structure 312, and second external connectors 406 are formed over the second UBMs 438. The second conductive connectors 440 may comprise, for example, contact bumps or solder balls, although any suitable types of connectors may be utilized. In an embodiment in which the second external connectors 406 comprise second conductive connectors 440 such as contact bumps, the second external connectors 406 may include a material such as tin, or other suitable materials, such as silver, lead-free tin, or copper. In an embodiment in which the second external connectors 406 are tin solder bumps, the second external connectors 406 may be formed by initially forming a layer of tin using such a technique such as evaporation, electroplating, printing, solder transfer, ball placement, etc. Once a layer of tin has been formed on the structure, a reflow may be performed in order to shape the material into the desired bump shape for the second external connectors 406. In some embodiments, the second external connectors 406 may have a thickness between about 2 µm and about 1000 µm. In some embodiments, the second external connectors 406 may have a pitch between about 250 µm and about 1250 µm. In some embodiments, the second external connectors 406 may be similar to the first external connectors 212 described above. FIG. 10A further illustrates a dashed outline highlighting a third region 1050 of the structure following the attachment of the second InFO device 900 to the interconnect structure 300.

In some embodiments, the protective layers 404 may be formed over the routing structures 312 and 316 as, for example, a solder resist material, and may be formed to protect the surfaces of the routing structures 312 or 316. In some embodiments, the protective layers 404 may be a photosensitive material formed by printing, lamination, spin-coating, or the like. The photosensitive material may then be exposed to an optical pattern and developed, forming openings in the photosensitive material. In other embodiments, the protective layers 404 may be formed by depositing a non-photosensitive dielectric layer (e.g., silicon oxide, silicon nitride, the like, or a combination), forming a patterned photoresist mask over the dielectric layer using suitable photolithography techniques, and then etching the dielectric layer using the patterned photoresist mask using a suitable etching process (e.g., wet etching or dry etching). The protective layers 404 may be formed and patterned over the routing structures 312 and 316 using the same techniques. In some embodiments, the protective layers 404 may have a thickness between about 10 µm and about 300 µm. Other processes and materials may also be used.

FIGS. 10A and 10B further illustrates a placement of the interconnect structure 300 into electrical connection with the second InFO device 900, in accordance with some embodiments. Although FIGS. 10A and 10B illustrate the wafer level package (WLP) 1000 comprising an individual InFO device (e.g., second InFO device 900) bonded to an individual interconnect structure (e.g., interconnect structure 300), it is understood that in other embodiments, the wafer level package (WLP) 1000 may comprise multiple interconnect structures (e.g., interconnect structure 300) bonded to multiple InFO devices (e.g., second InFO device 900) prior to singulating the multiple device structures into a plurality of distinct wafer level packages (e.g., wafer level package (WLP) 1000). In an embodiment, the interconnect structure 300 is placed into physical contact with the first external connectors 212 (comprising, e.g., the UBMs 138 and the conductive connectors 150) of the second InFO device 900 using, e.g., a pick and place process. The interconnect structure 300 may be placed such that exposed regions of the topmost routing layer (e.g., the additional routing layer 311 of the routing structure 312) is aligned with corresponding connectors of the first external connectors 212. Once aligned and placed in physical contact, a reflow process may be utilized to bond the first external connectors 212 of the second InFO device 900 to the interconnect structure 300. In some embodiments, external connectors are formed on the interconnect structure 300 instead of or in addition to the first external connectors 212 formed on the second InFO device 900. In some embodiments, the first external connectors 212 are not formed on the second InFO device 900, and the interconnect structure 300 is bonded to the second InFO device 900 using a direct bonding technique such as a thermo-compression bonding technique or other bonding techniques, such as hybrid bonding, dielectric to dielectric bonding, metal to metal bonding, combinations of these, or the like.

In FIGS. 10A and 10B, the molding underfill 402 is deposited in the gap between the interconnect structure 300 and the second InFO device 900. The molding underfill 402 may be a material such as a molding compound, an epoxy, an underfill, a molding underfill (MUF), a resin, or the like. The molding underfill 402 can protect the first external connectors 212 and provide structural support for the wafer level package (WLP) 1000. In some embodiments, the molding underfill 402 may be cured after deposition.

Additionally, in each of the above described embodiments, other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In some embodiments, a method includes: attaching a first semiconductor device to a substrate using a first die attach pad; attaching a second semiconductor device to the substrate using a second die attach pad; filling a gap between the first die attach pad and the second die attach pad and at least partially filling a gap between the first semiconductor device and the second semiconductor device with an encapsulant; depositing a protective coating over the encapsulant and over the first semiconductor device and the second semiconductor device, the depositing the protective coating filling a remainder of the gap between the first semiconductor device and the second semiconductor device; and forming a redistribution structure over the protective coating. In an embodiment the first semiconductor device comprises a system on chip. In an embodiment the second semiconductor device comprises a high bandwidth memory stack. In an embodiment a portion of the protective coating within the gap between the first semiconductor device and the second semiconductor device has a thickness less than about 20 µm. In an embodiment the depositing the protective coating comprises depositing a polyimide material. In an embodiment the method further includes forming external connectors over the redistribution structure, external contacts of the first semiconductor device and the second semiconductor device being electrically coupled to the external connectors. In an embodiment the method further includes attaching an interconnect structure to the redistribution structure opposite the first semiconductor device and the second semiconductor device.

According to some embodiments, a method includes: forming a first die attach pad and a second die attach pad separated from the first die attach pad onto a substrate; placing a first semiconductor die on the first die attach pad and a second semiconductor die on the second die attach pad; placing a leveling film over the first semiconductor die and the second semiconductor die; leveling the first semiconductor die and the second semiconductor die to a first level using the leveling film; depositing a molding compound over the substrate and at least partially filling a die gap between the first semiconductor die and the second semiconductor die from the substrate to the leveling film, an interface between the leveling film and the molding compound being at or below corner regions of the first semiconductor die and the second semiconductor die; removing the leveling film; depositing a dielectric layer over the molding compound and the first semiconductor die and the second semiconductor die; and forming a redistribution layer over the dielectric layer. In an embodiment the placing the leveling film comprises forming a seal with the leveling film over an upper surface and external contact of the first semiconductor die. In an embodiment the forming the seal comprises forming the seal over a corner region of intersecting sidewalls of the first semiconductor die. In an embodiment the leveling the first semiconductor die and the second semiconductor die to the first level further comprises deforming the first die attach pad to a first thickness and deforming the second die attach pad to a second thickness less than the first thickness such that external contacts of the first semiconductor die and the second semiconductor die are aligned at the first level. In an embodiment the forming the first die attach pad and the second die attach pad comprises forming the first die attach pad and the second die attach pad to a same initial thickness and to different widths. In an embodiment the method further includes forming external connectors over the redistribution layer, the external connectors being electrically coupled to external contacts of the first semiconductor die. In an embodiment the method further includes attaching an interposer structure to the redistribution layer, opposite the first semiconductor die and the second semiconductor die.

According to some embodiments, a semiconductor device includes: a first semiconductor die with first external contacts; a second semiconductor die with second external contacts, wherein the first external contacts and the second external contacts are disposed at a same level; an encapsulant at least partially filling a gap between the first semiconductor die and the second semiconductor die; a protection layer over the encapsulant, the first semiconductor die, and the second semiconductor die, wherein an interface between the protection layer and the encapsulant is disposed between sidewalls of the first semiconductor die and the second semiconductor die; and an redistribution structure over the protection layer, wherein the redistribution structure comprises a metallization layer electrically coupled to at least one of the first external contacts. In an embodiment a portion of the protective layer between the sidewalls of the first semiconductor die and the second semiconductor die has a thickness less than about 20 µm. In an embodiment the protection layer further comprises interfaces with sidewalls of the first semiconductor die and the second semiconductor die. In an embodiment one of the first semiconductor die and the second semiconductor die is a system on chip device and the other one of the first semiconductor die and the second semiconductor die is a high-bandwidth memory cube. In an embodiment the semiconductor device further includes external connectors over the redistribution structure, the external connectors being electrically coupled to contact pads of the first semiconductor die and the second semiconductor die. In an embodiment the semiconductor device further includes an interposer over the redistribution structure, wherein external contacts of the interposer are electrically coupled to the first semiconductor die and the second semiconductor die through the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching a first semiconductor device to a substrate using a first die attach pad;
attaching a second semiconductor device to the substrate using a second die attach pad;
filling a gap between the first die attach pad and the second die attach pad and at least partially filling a gap between the first semiconductor device and the second semiconductor device with an encapsulant;
depositing a protective coating over the encapsulant and over the first semiconductor device and the second semiconductor device, the depositing the protective coating filling a remainder of the gap between the first semiconductor device and the second semiconductor device; and
forming a redistribution structure over the protective coating.

2. The method of claim 1, wherein the first semiconductor device comprises a system on chip.

3. The method of claim 2, wherein the second semiconductor device comprises a high bandwidth memory stack.

4. The method of claim 1, wherein a portion of the protective coating within the gap between the first semiconductor device and the second semiconductor device has a thickness less than about 20 μm.

5. The method of claim 1, wherein the depositing the protective coating comprises depositing a polyimide material.

6. The method of claim 1, further comprising forming external connectors over the redistribution structure, external contacts of the first semiconductor device and the second semiconductor device being electrically coupled to the external connectors.

7. The method of claim 6, further comprising attaching an interconnect structure to the redistribution structure opposite the first semiconductor device and the second semiconductor device.

8. A method comprising:
forming a first die attach pad and a second die attach pad separated from the first die attach pad onto a substrate;
placing a first semiconductor die on the first die attach pad and a second semiconductor die on the second die attach pad;
placing a leveling film over the first semiconductor die and the second semiconductor die;
leveling the first semiconductor die and the second semiconductor die to a first level using the leveling film;
depositing a molding compound over the substrate and at least partially filling a die gap between the first semiconductor die and the second semiconductor die from the substrate to the leveling film, an interface between the leveling film and the molding compound being at or below corner regions of the first semiconductor die and the second semiconductor die;
removing the leveling film;
depositing a dielectric layer over the molding compound and the first semiconductor die and the second semiconductor die; and
forming a redistribution layer over the dielectric layer.

9. The method of claim 8, wherein the placing the leveling film comprises forming a seal with the leveling film over an upper surface and external contact of the first semiconductor die.

10. The method of claim 9, wherein the forming the seal comprises forming the seal over a corner region of intersecting sidewalls of the first semiconductor die.

11. The method of claim 8, wherein the leveling the first semiconductor die and the second semiconductor die to the first level further comprises deforming the first die attach pad to a first thickness and deforming the second die attach pad to a second thickness less than the first thickness such that external contacts of the first semiconductor die and the second semiconductor die are aligned at the first level.

12. The method of claim 11, wherein the forming the first die attach pad and the second die attach pad comprises forming the first die attach pad and the second die attach pad to a same initial thickness and to different widths.

13. The method of claim 8, further comprising forming external connectors over the redistribution layer, the external connectors being electrically coupled to external contacts of the first semiconductor die.

14. The method of claim 13, further comprising attaching an interposer structure to the redistribution layer, opposite the first semiconductor die and the second semiconductor die.

15. A method comprising:
receiving a first semiconductor die with first external contacts;
receiving a second semiconductor die with second external contacts;
encapsulating the first semiconductor die and the second semiconductor die, wherein after the encapsulating the encapsulant at least partially fills a gap between the first semiconductor die and the second semiconductor die, and wherein the first external contacts and the second external contacts are disposed at a same level;
forming a protection layer over the encapsulant, the first semiconductor die, and the second semiconductor die, wherein an interface between the protection layer and the encapsulant is disposed between sidewalls of the first semiconductor die and the second semiconductor die; and
forming a redistribution structure over the protection layer, wherein the redistribution structure comprises a metallization layer electrically coupled to at least one of the first external contacts.

16. The method of claim 15, wherein a portion of the protective layer between the sidewalls of the first semiconductor die and the second semiconductor die has a thickness less than about 20 μm.

17. The method of claim 16, wherein after the forming the protection layer the protection layer further comprises interfaces with sidewalls of the first semiconductor die and the second semiconductor die.

18. The method of claim 15, wherein one of the first semiconductor die and the second semiconductor die is a system on chip device and the other one of the first semiconductor die and the second semiconductor die is a high-bandwidth memory cube.

19. The method of claim 15, further comprising forming external connectors over the redistribution structure, the external connectors being electrically coupled to contact pads of the first semiconductor die and the second semiconductor die.

20. The method of claim 19, further comprising placing an interposer over the redistribution structure, wherein external contacts of the interposer are electrically coupled to the first semiconductor die and the second semiconductor die through the redistribution structure.

\* \* \* \* \*